United States Patent [19]

Janai et al.

[11] 3,999,990
[45] Dec. 28, 1976

[54] IMAGING BY LIGHT-ENHANCED VAPORIZATION

[75] Inventors: Meir Janai; Peter S. Rudman, both of Haifa, Israel

[73] Assignee: Technion Research and Development Foundation, Ltd., Haifa, Israel

[22] Filed: Aug. 23, 1974

[21] Appl. No.: 500,168

[30] Foreign Application Priority Data

Aug. 28, 1973 United Kingdom ............ 40442/73
Aug. 28, 1973 United Kingdom ............ 40443/73

[52] U.S. Cl. .............................. 96/27 R; 96/1 R; 96/1.1; 96/36; 96/36.2; 96/36.3; 96/45
[51] Int. Cl.² ...................... G03C 5/00; G03C 5/04
[58] Field of Search .............. 96/27 R, 1 R, 1.1, 36, 96/36.2, 36.3, 45

[56] References Cited

UNITED STATES PATENTS

| | | |
|---|---|---|
| 3,386,823 | 6/1968 | Keller et al. ............ 96/27 R |
| 3,637,377 | 1/1972 | Hallman et al. ............ 96/27 R |
| 3,637,378 | 1/1972 | Hallman et al. ............ 96/27 R |
| 3,637,380 | 1/1972 | Hallman et al. ............ 96/27 R |
| 3,637,381 | 1/1972 | Hallman et al. ............ 96/27 R |
| 3,707,372 | 12/1972 | Hallman et al. ............ 96/27 R |

*Primary Examiner*—Edward C. Kimlin
*Attorney, Agent, or Firm*—Browdy and Neimark

[57] ABSTRACT

An imaging method involves a substrate having a coating which undergoes a photochemical conversion upon being irradiated to yield only products whose vapor pressure under the operative temperature is higher than that of the coating. In this way as a result of the selective vaporization of the coating the desired image is obtained. The new method has wide applications such as photography, production of microfilms, electrophotographic document duplication, production of master prints for offset printing, etc.

18 Claims, 15 Drawing Figures

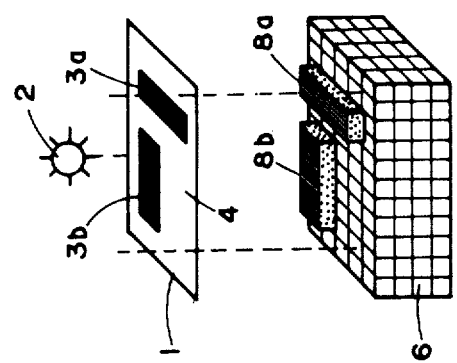
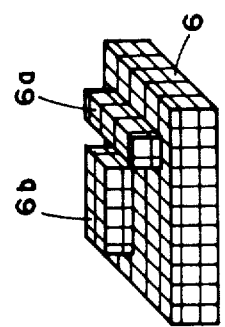
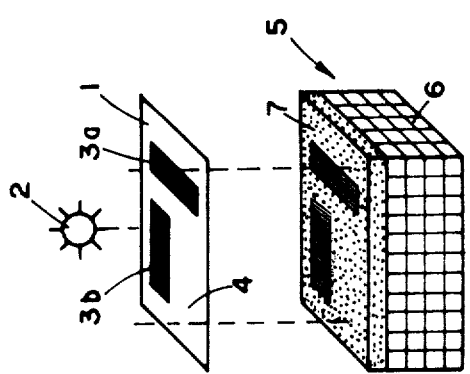
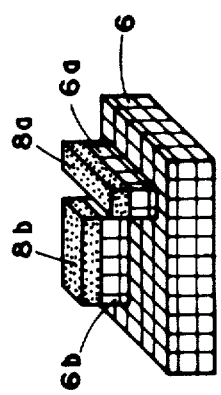

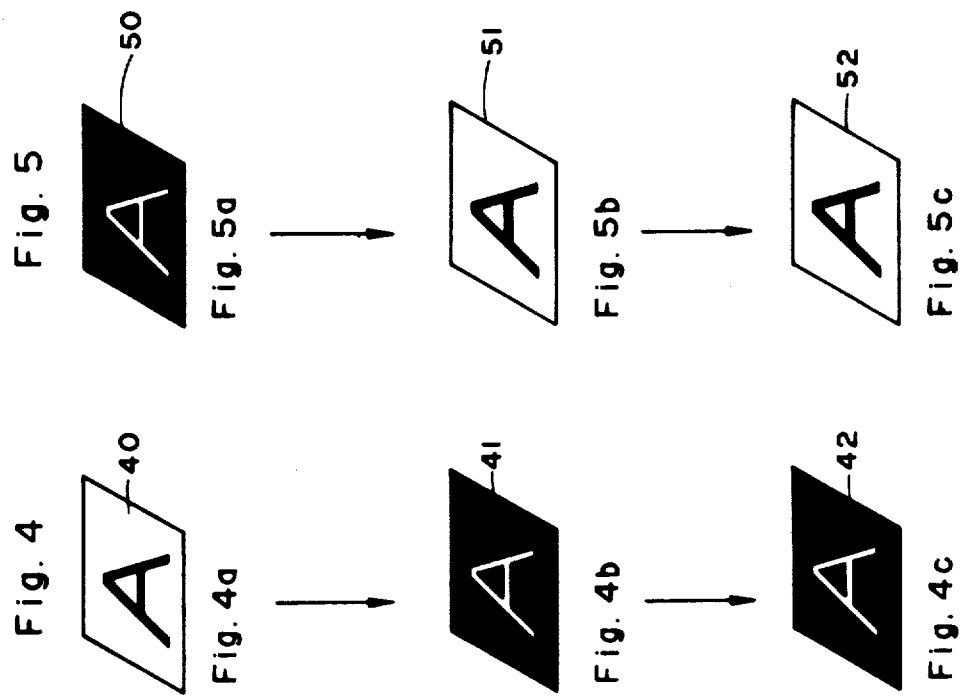
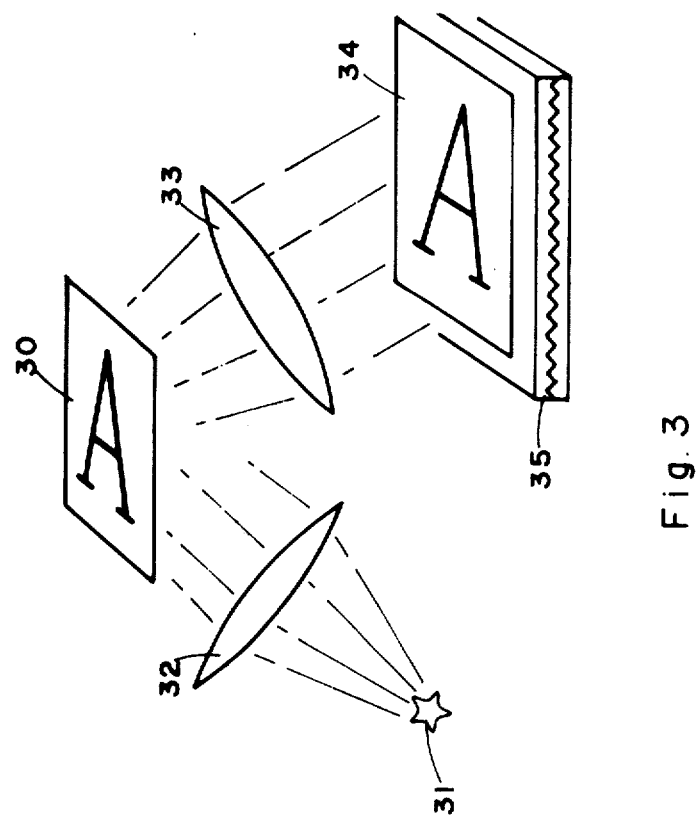

IMAGING BY LIGHT-ENHANCED VAPORIZATION

The present invention relates to a new imaging method.

Various imaging methods are known for a variety of purposes. There thus exist photographic processes in which a light sensitive emulsion is exposed for a short duration of time to light reflected from or admitted through the object to be imaged, whereafter the emulsion is developed into a negative form which a positive is produced.

Photographic processes are also employed in the production of master plates for duplication purposes, e.g. by offset printing.

There are also known various electrophotographic document duplication methods. These known methods do not produce directly a master plate but rather require either a costly and slow reexposure of the original document for each copy, or the production of a master plate by a secondary process, e.g. by a photo-litho process.

There are also known various imaging processes for the production of etching masks wherein the pattern is determined by a light image that irradiates an initially uniform mask. This technique is employed, for example, in the manufacture of integrated and printed circuits. Such processes usually employ various photosensitive resins which have the disadvantage of being expensive, having a limited shelf-life, do in many cases not adhere well to the substrate and for precise applications require meticulous and time-consuming procedures.

It is the object of the present invention to provide a simple and versatile imaging method suitable for applications in various different fields and, by having a high degree of resolution, affords a high degree of precision.

With these objects in view there is provided in accordance with the present invention a method of imaging an object comprising subjecting to radiation that is differentially admitted through or reflected by said object a composite body comprising a substrate and a radiation sensitive coating capable of undergoing upon irradiation a photochemical conversion to yield exclusively a product or products whose vapour pressure(s) under the operative temperature is or are higher than that of the coating, thereby to project on said coating an image of the original object, and continuing the irradiation until a permanent image is produced on the coating.

In many cases it will be preferable to keep the composite body at an elevated temperature, depending on the nature of the substrate and the coating. The operational temperature will be so selected that while it does not bring about any appreciable evaporation of the coating before irradiation, the vapour pressure of the photochemical conversion product(s) resulting from irradiation is at this temperature sufficiently high so that the imaging process proceeds at a practical speed.

The imaging process in accordance with the invention may be conducted under controlled conditions with suitable monitoring. It is thus possible to observe the formation of the image either directly or through a suitable optical system and to interrupt the irradiation when a desired contrast between the irradiated and non-irradiated areas has been obtained.

It is a feature of the present invention that the photochemical conversion occurs only at the sites at which the irradiation impinges with no heat dissipation requirements, no chain reactions and the like, and in consequence the resolution obtained in the imaging method according to the invention is very sharp. This then constitutes a significant advantage of the invention.

It is thus seen that in accordance with the invention there is provided a simple and accurate imaging method which in one single stage yields an accurate reproduction of the original object.

In practising the method according to the invention there is no restriction on the kind of radiation employed, and the most suitable type of radiation to be employed under given circumstances will be selected in accordance with the nature of the object and/or the radiation sensitive coating. Since the photochemical behaviour of any particular coating is known from the literature or, in the absence of sufficient literature data, may be established by simple trial and error experimentation, it is a simple matter for the operator to select the proper type of radiation for a given set of circumstances. Thus in one case ultraviolet radiation may be preferred, in other visible light, yet in other infra-red radiation, still in other cases X-rays and yet in other cases various particle radiations.

There are also no critical limitations on the nature of the substrate. In any particular case the substrate has to fulfill the following requirements:

a. it must be adapted for good adhesion to the coating;
b. it should not react with either the coating or any of its photochemical conversion products;
c. it should be resistant to any further processing which might be required pursuant to the imaging in accordance with the present invention; and
d. it should meet the physical, chemical and mechanical requirements for the imaging product.

The following are some examples of radiation sensitive material that can be employed in accordance with the invention:

$As_lS_m$ where $l$ and $m$ are each numbers of from 1 to 5, a typical example being $As_2S_3$; $As_nSe_o$ where n and o are numbers from 1 to 5; $As_pS_qX_r$ where X is a halide and p, q and r are numbers of from 1 to 5; $HgX_2$ where X is a halide; $HgS$; $HgC_2O_4$ (mercury oxalate). This list is of course not exhaustive and as mentioned above, any material that is radiation sensitive to produce upon irradiation a product or products that at the operational temperature is or are more volatile than the coating itself may be used.

The conversions occurring with some of the above materials upon irradiation may be represented by the following equations:

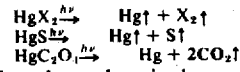

The photochemical conversion may be one of composition or decomposition.

One typical example of a radiation sensitive material that can be employed in accordance with the present invention is amorphous arsenic sulfide $As_2S_3$. For the purpose of practising the imaging method in accordance with the invention with that material, it is possible to proceed as follows:

1. a thin film approximately $1\mu$ thick, is deposited on a substrate, e.g. by sublimation in vacuo or under an inert atmosphere, such as argon, at about 400° C;

2. the composite body is heated uniformly to a temperature within the range of 150°–200° C;

3. the $As_2S_3$ coating is exposed to an image projecting radiation and in consequence, where the light impinges there occurs a photochemical decomposition which may be presented as follows:

$$As_2S_3 \xrightarrow{h\nu} 2As + 3S\uparrow$$

Be performing the exposure in an oxygen containing atmosphere, e.g., in the air, the arsenic oxidizes in accordance with the following reaction scheme:

$$4As + 3O_2 \rightarrow 2As_2O_3\uparrow$$

As $As_2O_3$ and S are both much more volatile than $As_2S_3$ at a temperature range of 150°–200° C, the irradiation leads to a partial exposure of the substrate and thereby to the imaging of the original object.

In accordance with the present invention there is also provided for the purpose of carrying out the imaging method as specified, a composite body comprising a substrate and a radiation sensitive coating capable of undergoing upon irradiation a photochemical conversion to yield exclusively a product or products whose vapour pressure(s) at the operational temperature is or are higher than that of the coating.

The invention may be practised for various different applications. Thus in one of its applications it may be used for the production of a patterned etching mask to enable subsequent patterned etching of the substrate. In practising the invention for this purpose the substrate to be etched is coated with an irradiation sensitive coating of the kind specified hereinbefore and the desired masking pattern is then radiation-projected on the coating, e.g. by irradiating the substrate through a transparent plate on which the desired pattern is drawn or printed with a paint or ink that is essentially non-transparent to the radiation employed. Alternatively, the masking pattern can be formed by a programmed scanning with the particular radiation employed (light, particles, etc.). For the projection it is possible to use a reducing or magnifying optical system so that the pattern image is reproduced on the radiation sensitive coating at the desired size.

This patterned masking technique may be employed, for example, in the production of an integrated circuit on a semi-conductor substrate. The substrate may, for example, be a silicon crystal chip covered by $SiO_2$ coated with arsenic sulfide $As_2S_3$ in the manner specified hereinbefore. The time of irradiation for proper imaging by complete decomposition and evaporation of the arsenic sulfide from the irradiated zone in the manner explained hereinbefore, depends on the thickness of the coating layer and the type of radiation used; as a rule it will be of the order of minutes.

After completion of the imaging the imaged composite body is treated with an etching agent, e.g. hydrofluoric acid HF, by which treatment any non-masked portion of the $SiO_2$ substrate is etched while the unexposed portions which are still masked with $As_2S_3$ remain unaffected, $As_2S_3$ being resistant to HF. In this way a predetermined relief pattern is obtained. After the completion of the etching the $As_2S_3$ masking left on the relief pattern is stripped off by treatment with an alkali, e.g. KOH, or any other suitable solvent capable of removing the $As_2S_3$. Following this stripping the body with relief pattern on one of its faces is subjected to any conventional treatment for the introduction of an integrated circuit.

Where different substrates and/or different coatings are used, different etching and stripping agents may have to be employed, to be selected in accordance with the known chemical properties of both the substrate and coating.

The same technique may also be employed in the production of printed circuits.

It should be added that in the above outlined process for the preparation of a pattern for the production of an integrated circuit, the irradiation sensitive coating, e.g. $As_2S_3$, remaining on the relief pattern after etching need not necessarily be removed and may be left as part of the integrated circuit.

The above outlined patterned masking method according to the invention is faster, the equipment requirements are simpler and hence the processing costs are less than in conventional methods. The method according to the invention lends itself to automatization.

A further application of the present invention concerns photographic reproduction, positive or negative. Such reproduction may be at any desired scale, i.e., natural size, enlarged or reduced size, and it is also possible to produce microfilms. The technique in this case is similar as in the above described patterned masking method. One of the great advantages of photographic reproduction in accordance with the invention is that it is carried out in one single step and no development is required after imaging. A further advantage resides in the fact that the photochemical conversion of the coating into volatile products is a relatively slow process. Due to this property the photographic reproduction in accordance with the invention may be conducted under suitable monitoring and the process may be interrupted at any stage after a desired degree of contrast has been achieved.

Yet another very substantial advantage of the imaging method in accordance with the present invention, whether for normal photography or photoproduction of microfilm, is the fact that the imaged film has add-on and erasure capabilities. At any time after an imaging exposure information can be added to previously unexposed portions of the coating, or information can be selectively erased by selective light enhanced vaporization at previously unexposed areas.

Where the above photographic reproduction is used for the production of microfilms both the coating and the substrate must be compatible with conventional microfilm readers. It has been found that for this purpose it is again possible to use among others amorphous $As_2S_3$ as radiation sensitive coating. The substrate should be of a suitable flexible plastic material, one example being the material known under the trade name NALOPHAN supplied by Kalle AG of Switzerland.

If necessary, it is possible to improve the contrasting in the image projected through a conventional reader of a microfilm produced in accordance with the invention, by adding to the reader selective absorption or interference filters.

A further way to improve the contrasting is to coat the film after exposure with a contrast increasing dye: a dye that selectively absorbs in the remaining coating produces a higher contrast positive image, while a dye that selectively absorbs in the plastic base produces a higher contrast negative image.

It is also possible in accordance with the invention to prepare the radiation sensitive coating in such a way that there will be half-tone reproduction. For this purpose the radiation sensitive coating must be prepared in a special, regularly varying way, e.g., with ridges and grooves so that different radiation intensities will produce different degrees of evaporation in consequence of photochemical conversion.

Yet another application of the present invention concerns the production of master plates for electrostatic printing. Such a master plate in which the image is permanent, may be used for printing a large number of duplicates of an original document by an electrophotographic process wherein a charged toner adheres electrostatically to the master plate according to its electrical conductivity pattern.

Various electrophotographic document duplication processes are known, a typical such process being the one known under the trade name XEROX. None of the known processes directly produces a master plate but rather requires either a costly and slow reexposure of the original document for each duplication or the secondary production of a master plate as in the well known photo-litho process.

In accordance with the invention all these disadvantages are obviated. For this purpose, according to the invention, the electrophotographic master plate consists of an electrically conductive base, e.g. of aluminum, coated with a thin layer of a radiation sensitive electrically non-conductive material, e.g. $As_2S_3$. Upon exposure of such a plate to an imaging of an original document or any other desired object, the image produced on the plate in consequence of selective photochemical conversion and evaporation is permanent, and any desired number of duplicates may be made therefrom by the electrophotographic process. This duplication method is considerably cheaper than ordinary electrophotographic methods in which for each duplication re-exposure of the original document is required, and is considerably simpler and faster than the duplication procedure wherein a master plate is produced from a first duplicate in a secondary process, which plate is then used for mass duplication, e.g. in the photo-litho process.

Yet another application of the present invention consists in the production of master plates for offset printing. In this case the coating and base have to be so selected that they have differential wetabilities by printing ink, so that after imaging by exposure in accordance with the present invention a differential printing pattern is produced by the application of ink to the plate. For example, the base may be oleophilic, e.g. some kind of wax, and be coated with a layer of $As_2S_3$ which is oleophobic; or conversely, the base may be oleophobic and the coating oleophilic.

The production of offset printing master plates in accordance with the present invention excells over known processes by its simplicity and accuracy. Here again halftone techniques may be employed as specified above and as will be explained further below with reference to the drawings.

As mentioned before the use of amorphous arsenic sulfide $As_2S_3$ as the radiation sensitive coating is a representative example to which, however, the invention is not limited. The use of this and similar materials has the following advantages:

1. the material is inexpensive and readily available;
2. the material has essentially infinite shelf-life;
3. the material can be handled in ambient light since the vapour pressure differences between exposed and unexposed areas becomes appreciable only at elevated temperature of the order of 150°–200° C;
4. a high degree of resolution is obtained because:
   a. there is low light scattering and the imaging beam is not diffused;
   b. it is always possible to select the pair of coating and substrate in such a way that good adherence is ensured;
   c. where, as in the case of $As_2S_3$, the radiation sensitive coating is non-crystalline there is no grain size resolution problem.

The invention will now be described with reference to the attached drawings in which:

FIGS. 1A-1D show diagrammatically four stages in the production of a relief pattern in accordance with the invention;

FIG. 3 is a diagrammatic representation of the production of a master plate for electrostatic printing in accordance with the invention;

FIGS. 4A-4C show the production of a negative duplicate from a positive image on an offset printing plate produced in accordance with the invention;

FIGS. 5A-5C show the production of a positive duplicate from a negative image on an offset printing plate produced in accordance with the invention.

Figure 2:
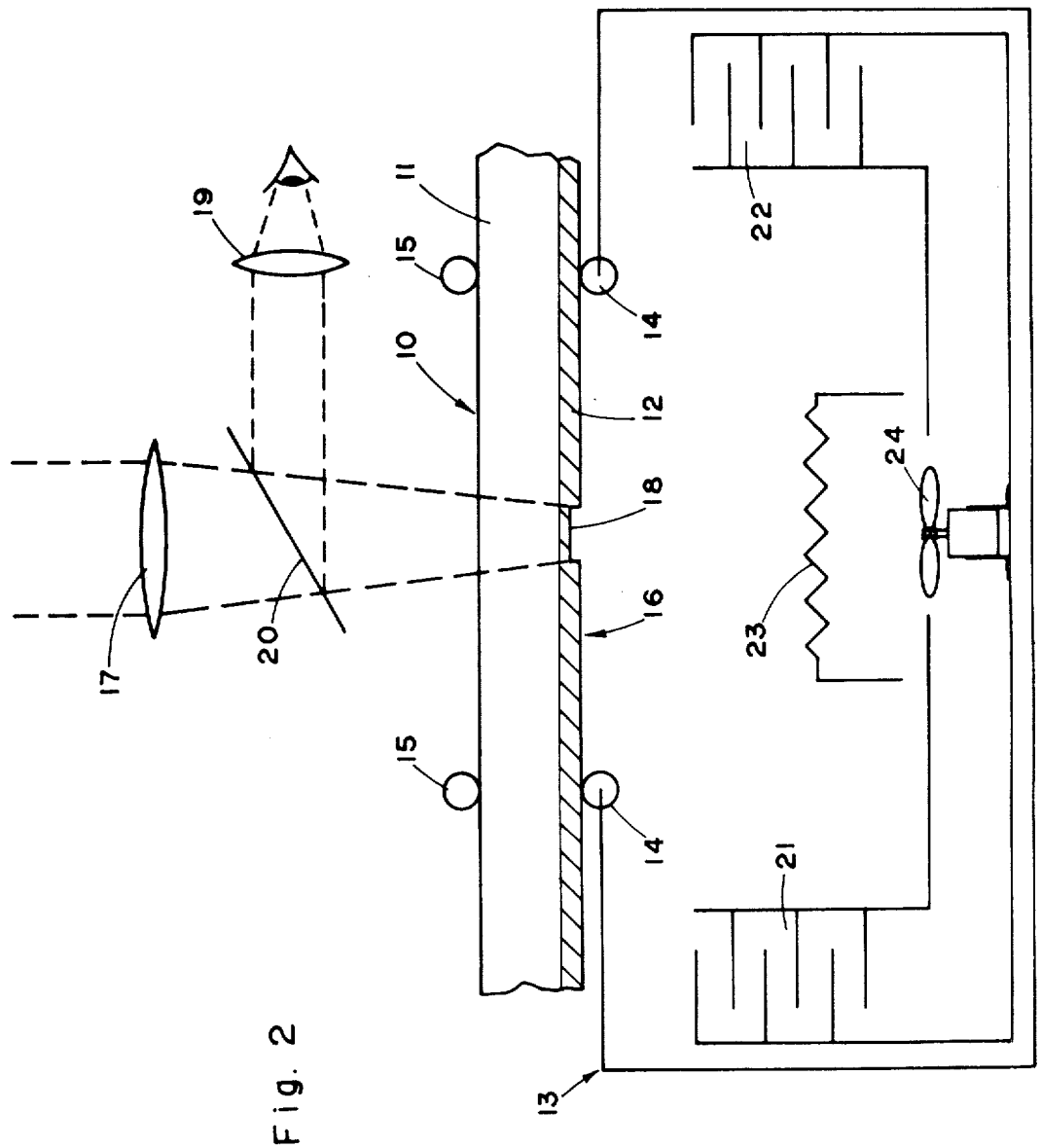
FIG. 2 is a diagrammatic representation of an apparatus for the production of a microfilm in accordance with the present invention.

As shown in FIG. 1A an original mask design 1 whose pattern corresponds to that which it is desired to reproduce as a patterned relief is irradiated by a radiation source 2, e.g. a visible light produced by an incandescent lamp. The pattern on image 1 comprises black, essentially non-transparent portions 3a and 3b and a transparent zone 4.

Underneath image 1 is located a composite body 5 comprising a $SiO_2$ substrate 6 and a radiation sensitive coating 7, e.g. of $As_2S_3$.

FIG. 1A shows the state of the substrate at the beginning of irradiation and the would-be relief pattern is shown on the top of the layer 7 in a shaded way.

FIG. 1B shows the result of a several minutes exposure. As can be seen only relief portions 8a and 8b remain from the original coating 7, corresponding in shape and size to the non-transparent zones 3a and 3b of the original design 1, while the remainder of the radiation sensitive layer 7 has been removed in consequence of the decomposition of the arsenic sulfide in accordance with the equations

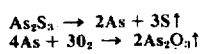

In the next following operational stage shown in FIG. 1C the composite body is etched, e.g. with HF, and in consequence the surface of substrate 6 is uniformly removed with the exception of the still coated portions 8a and 8b, a relief pattern comprising protruding portions 6a and 6b having, respectively, coatings 8a and 8b of the radiation sensitive material being produced.

The above etching stage is followed by the removal of the layer portions 8a and 8b from the protruding portions 6a and 6b leaving as final product an $SiO_2$ body with protruding portions 6a and 6b forming the desired relief pattern, as shown in FIG. 1D.

FIG. 2 shows diagrammatically a device for microfilm photography in accordance with the invention, which device is designed in such a way as to prevent pollution of the environment by any poisonous gases formed through the photochemical decomposition of the radiation sensitive layer.

As shown a film 10 according to the invention, comprising a transparent substrate 11 and a radiation sensitive coating 12 is mounted on top of a casing 13 between pairs of rollers 14 and 15 so as to be movable in a tight manner. The movable film 10 seals off an opening 16 of casing 13 and thereby prevents the escape of any gases from the interior of the casing.

An object (not shown) is projected by means of an appropriate radiation, e.g. visible light, whose source is equally not shown, through a reducing optical system symbolised in the drawing by a lens 17, through the transparent base 11 onto the sensitive layer 12 of film 10. In consequence of this projection the original object is imaged at reduced scale and the image is symbolized in the drawing by a recess 18 in the sensitive layer 12. The imaging may be monitored by a monitoring system comprising an optical system symbolized by a lens 19 and a mirror 20 so mounted and designed as not to interfere with the imaging.

Inside the casing 13 are provided a pair of condensers 21 and 22, a heater 23 and a fan 24. Heater 23 keeps that portion of the radiation sensitive layer 12 that is being exposed at the desired temperature at which the difference between the vapour pressure of the original coating and its photochemical conversion products assumes practical values. During the exposure the gaseous conversion products, e.g. $As_2O_3$ and S in the case of $As_2S_3$ being the radiation sensitive layer, cannot escape through the opening and by the internal gas circulation inside the casing 13, brought about by fan 24, these gases are driven into condensers 21 and 22 where they are condensed into solid state.

FIG. 3 shows in a diagrammatic way the production of a master plate for electrostatic printing. An original document 30 is illuminated by a light source 31, e.g. a mercury arc lamp, through an optical system symbolized by a lens 32. The document 30 reflects the light arriving from source 31 through the optical system 32, and the reflected light passes through another optical system symbolized by a lens 33 and is projected onto a master plate 34 comprising a conductive base, e.g. of aluminum, coated with a radiation sensitive layer, e.g. of arsenic sulfide. In accordance with the invention plate 34 rests on a heater 35. The image of the original document symbolized herein by the letter A, is reproduced as a positive on the master plate 34 in consequence of a total photochemical conversion and subsequential evaporation of the coating except along the pattern of the image. The result is a differential electric behaviour, in that the portions of the plate around the image are electrically conductive while the image forming coated portions are not. This behaviour of the plate makes it suitable for electrophotographic duplication, e.g. by the process known as xeroprinting.

FIGS. 4A-C and 5A-C show how to use a master plate produced by an imaging process in accordance with the invention, for offset printing. In FIG. 4A, 40 is a plate with a positive image of an original document produced thereon in accordance with the invention. The base of plate 40 is oleophilic while the radiation sensitive coating is oleophobic. The positive image is symbolized by the letter A. FIG. 4B shows the consequence of the treatment of the plate with an oil-based paint emulsion. The emulsion 41 adheres to the oleophilic base but does not adhere to the oleophobic image pattern. FIG. 4C shows the print 42 produced by the plate and it is seen that this is a negative of the original.

In FIG. 5A, 50 is the negative image of an original document produced on a composite body with a radiation sensitive coating in accordance with the invention. The base of this body is, like in the previous case, of an oleophilic material while the radiation sensitive coating is, again like in the previous case, oleophobic. The image is again symbolized by the letter A. It is seen that in this way a negative duplicate of the original positive image of an object is produced.

The result of the treatment of the image of FIG. 5A with an oil based paint emulsion is shown in FIG. 5B. As in this case the oleophobic radiation sensitive coating is only removed along the image pattern and remains on the remainder of the plate, only the pattern becomes coated by the paint 51 and only it is reproduced on the print 52 shown in FIG. 5C. It is thus seen that in this way a positive duplicate of the original negative image of an object is produced.

Figure 6:
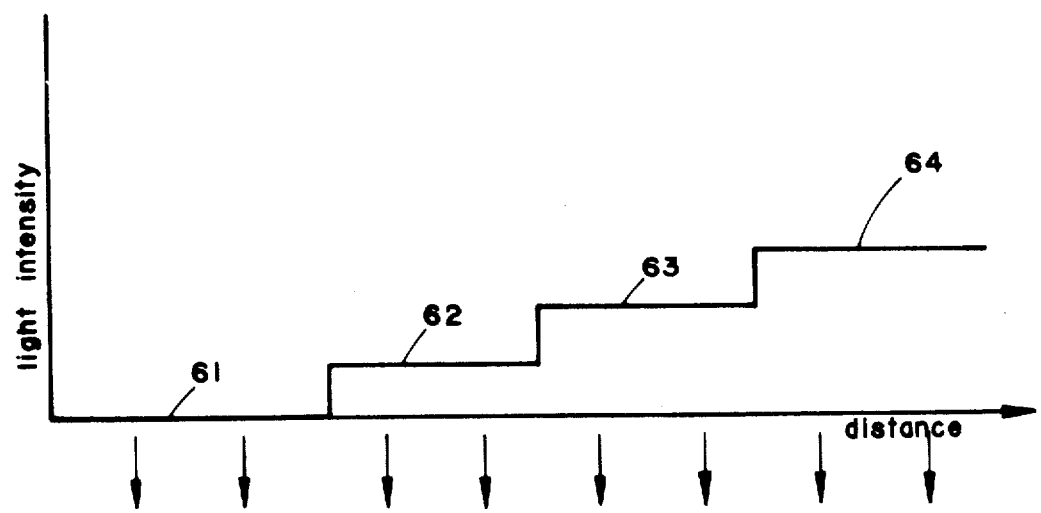
FIGS. 6, 7 and 8 show in a diagrammatic way a halftone reproduction on an offset master plate in accordance with the invention.
Figure 7:
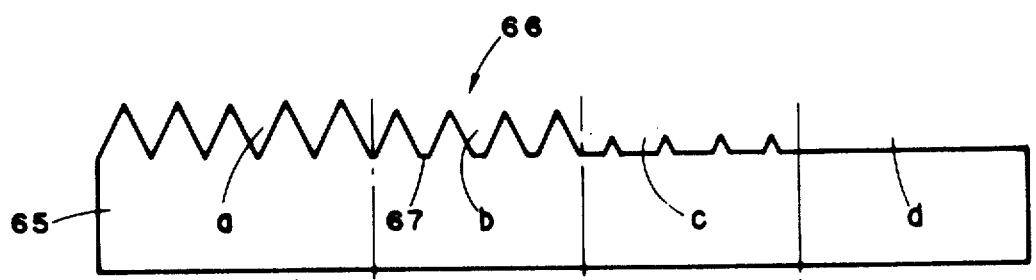
Figure 8:
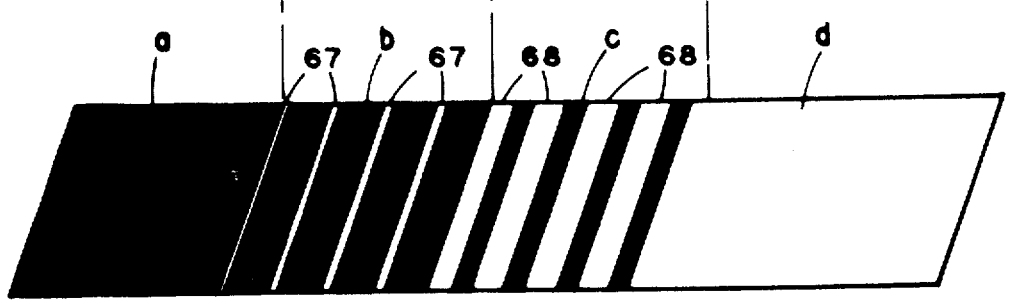

FIGS. 6, 7 and 8 show diagrammatically the production of a half-tone offset master plate. FIG. 6 shows the light distribution along a certain area of the image. As shown the light intensity increases stepwise from zero in zone 61 to higher values in zones 62, 63 and 64.

As shown in FIG. 7 the composite body according to the invention in this case comprises a base 65 and an uneven radiation sensitive coating 66 which is in the form of regularly recurring ridges and grooves. Portion a of the composite body corresponds to the radiation zone 61 in FIG. 6 with light intensity 0. In that portion none of the radiation sensitive coating 66 is removed. Portion b corresponds to the radiation intensity zone 62. In this portion, during the given exposure, only part of the coating 66 is removed in consequence of the radiation which results in the diminishing of the ridges of the coating and the formation of exposed strips 67. In portion c which is irradiated by the higher intensity of zone 63 the removal of the coating 66 during the same time in consequence of irradiation is more intense and this results in a greater diminution of the ridges of the coating and the formation of broader exposed strips 68. Finally, portion d is irradiated by the highest intensity of zone 64 and here during the given time of irradiation the coating is completely removed resulting in a complete exposure of portion d.

Like in the case of FIGS. 4A-C and 5A-C, the base of the offset printing plate is oleophilic while the radiation sensitive coating 66 is oleophobic. In consequence the further use of the exposed plates for offset printing is as in case of FIGS. 4A-C and 5A-C and by the printing process a half-tone print is obtained.

The uneven radiation sensitive coating, e.g. of the kind illustrated in FIG. 7, for the purpose of producing an offset printing master plate for half-tone reproduction, can be produced by special application techniques. Alternatively it is possible to produce first an even coating and then to impart to it regularly recurring unevenness, e.g. by preliminary exposure through a fine screen or diffraction grating.

We claim:

1. A method of imaging an object comprising subjecting to radiation that is differentially admitted through or reflected by said object a composite body comprising a substrate and a radiation sensitive coating selected from the group consisting of $As_lS_m$, $As_nSe_o$ and $As_pS_qX_r$ where l, m, n, o, p, q and r are each an integer from 1 to 5 and X is halogen, which coating is capable of undergoing upon irradiation a photochemical conversion to yield exclusively a product or products whose vapour pressure(s) under the operative temperature is or are higher than that of the coating thereby to cause evaporation of said product or products of conversion and to produce on said coating an image of the original object, and continuing the irradiation until a permanent image is produced by evaporation of said product or products of conversion, said substrate being so selected as not to react with either the coating or any photochemical conversion product thereof.

2. A method according to claim 1, wherein the composite body is kept at an elevated temperature of from 150° to 200° C at which there is an appreciable difference between the vapour pressures of the coating and its photochemical conversion product(s).

3. A method according to claim 1, wherein the radiation sensitive coating is $As_2S_3$.

4. A method according to claim 1 applied to the production of a patterned relief on a substrate, comprising exposing said composite body to radiation so as to produce thereon the image of an original pattern and treating the imaged body with an etching agent that selectively attacks the exposed substrate and does not attack the unexposed, coated portions.

5. A method according to claim 4, comprising stripping the remaining coating after etching.

6. A method according to claim 4, employed in the production of integrated circuits, the substrate being a semi-conductor.

7. A method according to claim 4, employed in the production of printed circuits.

8. A method according to claim 1, applied to photographic reproduction.

9. A method according to claim 1, applied to production of microfilms, the substrate being a pliable transparent material.

10. A method according to claim 1, wherein after exposure the contrasting is improved by treatment of the exposed film with a dye that is selectively absorbed by either the exposed or coated portions of film.

11. A method according to claim 9, wherein the film under exposure is mounted to cover an opening of an otherwise sealed casing in such a way that the opening is sealed by the film, the transparent substrate facing the radiation source and the coating facing the casing, which casing comprises: a heater for uniform heating of the film portion that seals said opening and being under exposure to radiation; a fan for internal gas circulation; and at least one condenser for the condensation of the gaseous products of said photochemical conversion.

12. A method according to claim 1, applied to production of a master plate for electrophotographic reproduction, the substrate being of an electrically conductive material.

13. A method of electrophotographic duplication of documets, comprising producing a permanent image on a master plate according to claim 12 and using this master plate for repeated printing of duplicates with the aid of a toner that adheres electrostatically to the unexposed, non-conductive portions of said plate.

14. A method according to claim 1, applied to the production of a master plate for offset printing, the substrate and coating having different wettability characteristics with respect to the printing ink or dye.

15. A method according to claim 14, wherein the substrate is oleophilic and the coating oleophobic.

16. A method according to claim 14, wherein the substrate is oleophobic and the coating oleophilic.

17. A method according to claim 1, wherein said coating comprises regularly recurring unevennesses thereby to be adapted to half-tone imaging.

18. A method according to claim 17, wherein said unevennesses are produced by preliminary exposure through a fine screen or a diffraction grating.

* * * * *